United States Patent [19]
Patton, III et al.

[11] Patent Number: 6,052,076
[45] Date of Patent: Apr. 18, 2000

[54] DIGITAL-TO-ANALOG CONVERTER HAVING HIGH RESOLUTION AND HIGH BANDWIDTH

[75] Inventors: Charles R. Patton, III; George J. Bennett, both of Murrieta, Calif.

[73] Assignee: Western Digital Corporation, Irvine, Calif.

[21] Appl. No.: 09/172,938

[22] Filed: Oct. 14, 1998

[51] Int. Cl.[7] ................................................. H03M 1/66
[52] U.S. Cl. .......................... 341/144; 375/238; 341/152
[58] Field of Search ..................... 341/144, 143, 341/145, 111, 113, 116, 152; 375/238

[56] References Cited

U.S. PATENT DOCUMENTS

| | | |
|---|---|---|
| 3,449,741 | 6/1969 | Egerton, Jr. . |
| 4,063,236 | 12/1977 | Amemiya et al. . |
| 4,375,636 | 3/1983 | Stack et al. . |
| 5,172,115 | 12/1992 | Kerth et al. . |
| 5,223,771 | 6/1993 | Chari . |
| 5,229,772 | 7/1993 | Hanlon . |
| 5,444,582 | 8/1995 | Suzuki . |
| 5,444,583 | 8/1995 | Ehrlich et al. . |
| 5,446,371 | 8/1995 | Eccleston et al. . |
| 5,721,648 | 2/1998 | Phan et al. . |
| 5,764,165 | 6/1998 | Buch . |
| 5,794,021 | 8/1998 | Hewitt .................................. 395/556 |
| 5,933,044 | 8/1999 | Callison .............................. 327/362 |

*Primary Examiner*—Brian Young
*Assistant Examiner*—Peguy JeanPierre
*Attorney, Agent, or Firm*—Milad G. Shara

[57] ABSTRACT

A digital-to-analog converter (DAC) is preferably employed to receive a digital input word and provide an analog output signal to a motor driver in a disk drive servo. The digital input word has a plurality of bit positions for establishing a resolution for the DAC. These bit positions define first and second groups of bits. The DAC comprises circuitry responsive to the first group of bits for producing a pair of analog signals defining a common-mode magnitude and a differential magnitude. The common-mode magnitude is a function of the value of the first set of bits and the differential magnitude is a function of the number of bit positions in the first group of bits. In the DAC: a clock generates a clocking signal; a state machine has an input for receiving the clocking signal, an input for receiving the second groups of bits, and an output for providing a time-varying control signal; switching circuitry has a pair of inputs for receiving the pair of analog signals, an input for receiving the time-varying control signal, and an output for providing a pulse-width and amplitude modulated signal; and averaging circuitry responds to the pulse-width and amplitude modulated signal to producing the analog output signal.

11 Claims, 11 Drawing Sheets

DIGITAL-TO-ANALOG CONVERTER HAVING HIGH RESOLUTION AND HIGH BANDWIDTH

BACKGROUND OF THE INVENTION

1. Field of the Invention

In general, this invention relates to digital-to-analog converters. More particularly, it relates to a digital-to-analog converter incorporated in a servo that controls track positioning in a disk drive.

2. Description of the Prior Art

A digital-to-analog converter (DAC) receives an input signal in the form of a digital word that defines a coded value, and produces an analog output signal having a magnitude representing the coded value. In a disk drive, a sampled-data servo that controls track positioning includes a DAC sometimes referred to as a "demand DAC." The demand DAC has an input that receives digital words, one word at a time, in a sequence. A processor such as a microprocessor or digital signal processor supplies the sequence of digital words to the demand DAC which supplies its analog output signal to a driver circuit for a coil of an actuator motor. Each digital word in the sequence is coded (typically in the form of a binary code) to represent a demanded amount of current to flow through the actuator motor. The demand DAC converts each digital word to cause the analog output signal it produces in the form of a voltage to have a magnitude corresponding to the coded value of the input digital word. The driver circuit receives the DAC output voltage and controls the current in the coil of the actuator motor accordingly.

The specifications for a DAC can involve a number of independent parameters including resolution, linearity, and bandwidth. For a demand DAC in a disk drive, low cost (i.e., relatively few components) is extremely important because the market for disk drives is highly cost-competitive. Also, for a demand DAC, it is important that the demand DAC exhibit "monotonicity."

As for resolution, this specification involves the number of bit positions in the input digital word. For example, a digital word having 8 bit positions can define $2^8$ (i.e., 256) different values; such an 8-bit word provides for a resolution of 1 out of 256. A digital word having 10 bit positions can define $2^{10}$ (i.e., 1024) different values; such a 10-bit word provides for a resolution of 1 out of 1024. In a contemporary hard disk drive, a demand DAC must meet exacting specifications for resolution. This is so because the servo in a contemporary hard disk drive must provide very precise control over the magnitude of the current in the actuator motor during track-following operations in maintaining position relative to any one of the very large number of tracks of a high tracks per inch (tpi) drive.

As for linearity, each change of a fixed amount in the value of the digital input desirably results in a change of a fixed amount in the magnitude of the analog output signal. "Monotonicity" is a related requirement; it requires that every change in one direction (either higher or lower) in the value of the digital input results in a change in one direction in the magnitude of the analog output signal. Failure to meet the requirement for monotonicity is very disadvantageous for a demand DAC. For example, upon calculating a servo error, the servo can demand an increase in actuator current, but a DAC whose response is not fully monotonic can disadvantageously cause a decrease in actuator current.

As for bandwidth, this specification relates to rapidity with which the DAC can receive a new value and complete production of the corresponding magnitude for the output signal. Bandwidth can be considered the inverse of the time interval that elapses between the initiation of conversion and the completion of conversion. Conversion time can involve multiple time-delay elements such as "slew rate" and "settling time." As set forth in U.S. Pat. No. 5,764,165 titled "ROTATED COUNTER BIT PULSE WIDTH MODULATED DIGITAL TO ANALOG CONVERTER" (the '165 patent), time delays in the operation of a DAC prove critical in certain applications, an important such application being that of a demand DAC.

The '165 patent discloses a DAC that can be classified within a type referred to herein as a "time-averaging DAC," a term intended to embrace a pulse-width modulated (PWM) DAC and any related type of DAC such as a Binary Rate Multiplier (BRM) DAC.

As for a time-averaging DAC, whether a PWM DAC or a related DAC such as a BRM DAC, it includes a state machine, a switching circuit, and a low-pass filter circuit. The state machine receives a clock signal and the digital input word and in response produces a time-varying control signal. In accordance with the prior art, the switching circuit receives two fixed potentials such as a DC power supply potential and ground (0 volts). The switching circuit is controlled by the time-varying control signal to connect its output to one and then the other of the two fixed potentials to produce a signal described herein as a "pulse-percentage modulated signal."

In a PWM DAC, the pulse-percentage modulated signal is a pulse-width modulated signal. The duty cycle (the width of a pulse as a fraction of the overall cycle time or period) is proportional to the discrete value defined by the input digital word. For example, at a 50 percent duty cycle, i.e., on-time and off-time are equal, the pulse-width modulated signal represents a magnitude of one-half of full scale, and has an average value that is half way between the two fixed potentials. The low-pass filter receives the pulse-width modulated signal and in response produces the analog output signal. The averaging circuit comprises a low-pass filter suitably implemented by a resistor-capacitor (R-C) circuit.

In a BRM DAC the pulse-percentage modulated signal is defined by a variable number of fixed-width pulses during a fixed cycle time or period. Typically, the pulses are substantially uniformly distributed over the period. The averaging circuit produces an output signal such that its magnitude varies in accordance with the number of pulses per period.

Notwithstanding the low-pass filtering provided by the averaging circuit of a PWM or BRM DAC, the output signal has a residual ripple at a frequency equal to the reciprocal of the period of the time-averaging DAC. Ripple can be reduced by designing the averaging circuit to have a cutoff frequency that is low in relation to the reciprocal of the period. An undesirable tradeoff resulting from this approach is a reduction in bandwidth.

The bandwidth of a time-averaging DAC depends upon the resolution and upon the period of the clock. For example, if the resolution is ten bits and the clock frequency is 20 megahertz (MHz), then the averaging period for a typical prior art time-averaging DAC is 51.2 microseconds (210× 0.050 Ts=51.2 Ts). Desirably, ripple is reduced to a level approximately equal to the resolution. To do this, the time constant for the averaging circuit must be on the order of the resolution times the averaging period. If the resolution required is 14 bits and the clock frequency is 20 megahertz (MHz), then the averaging period for a typical prior art time-averaging DAC is 819.2 microseconds (214×0.050

Ts=819.2 Ts), and the time constant of the averaging circuit needs to be at least approximately 13.4 seconds (214×819.2 microseconds). That is, a relatively small increase in resolution generally results in a relatively great decrease in bandwidth.

Consequently, a typical prior art time-averaging DAC is generally considered to be unsuitable for use in systems requiring high-speed conversion of high-resolution words. Nevertheless, because a time-averaging DAC is quite economical in comparison to other types of DACs it is commonly used in systems in which the operating speed is relatively low and/or the input words to be converted have relatively low resolution.

Another type of DAC is commonly referred to as a "weighted-resistor DAC." Such a weighted-resistor DAC includes a set of resistors and a set of digitally controlled switches that each selectively connects a corresponding one of the resistors into a network that usually includes a summing node. Each resistor must have a resistance value that is weighted relative to the resistance values of the other resistors. Usually, a first resistor has the highest resistance value which is desirably exactly twice the resistance value of a second resistor which has the second highest resistance value, and the resistance value of the second resistor in turn is desirably exactly twice the resistance value of a third resistor, etc. The summing node sums currents flowing through the individually selected resistors that are switched into the network, thereby producing a current that corresponds to the digital input. An issue with respect to such a weighted-resistor DAC is the extent to which the various ratios can be accurately defined in a relatively low-cost structure. Consider the following with respect to this issue. Assume specifications require a resolution of a minimum step of 1 out of 1024 (10 bit positions in the digital word representing discrete values starting at a low value of 0 through a full-scale value of 1023). Under this assumption, the minimum step constitutes a change of 0.09775% of full scale. Assume that tolerances on the resistors allow the resistance values to depart from ideal by a percentage of approximately 0.2%. The resistor having the lowest resistance value (and greatest output) can have a resistance value that is slightly high whereas the resistor which has the second lowest resistance value together with all the other higher resistances can have a resistance value that is slightly low. With such a tolerance, a weighted-resistor DAC can fail to provide monotonicity; e.g., when the digital word changes upwardly from 0111111111 to 1000000000, the magnitude of the analog output signal can undesirably decrease.

A hybrid type of DAC can be partitioned into subsystems including modular circuitry for producing multiple time-varying control signals responsive to subsets of the bits of the input digital word, and including summing and filtering circuitry for producing the analog output signal in response to the multiple time-varying control signals. U. S. Pat. No. 5,444,583 to Ehrlich et al. appears to allude to such a hybrid type of DAC; see column 6, lines 13–20 thereof The foregoing background matters demonstrate that a need exists for a low-cost DAC architecture to provide a high-resolution and short conversion time.

SUMMARY OF THE INVENTION

This invention can be regarded as a digital-to-analog converter (DAC) that is preferably employed to receive a digital input word and provide an analog output signal to a motor driver in a disk drive servo. The digital input word has a plurality of bit positions for establishing a resolution for the DAC. These bit positions define first and second groups of bits. According to a distinguishing feature, the DAC comprises circuit means responsive to the first group of bits for producing a pair of analog control signals one of which defines a common-mode magnitude while the other of which defines a sum of the common-mode magnitude and a differential magnitude. The common-mode magnitude is a function of the value of the first set of bits and the differential magnitude is a function of the number of bit positions in the first group of bits.

The DAC includes a clock; a state machine; switching circuit means; and averaging circuit means. The clock generates a clocking signal. The state machine has an input for receiving the clocking signal, an input for receiving the second group of bits, and an output for providing a time-varying control signal. According to a distinguishing feature, the switching circuit means has a pair of inputs for receiving the pair of analog control signals, an input for receiving the time-varying control signal, and an output for providing a pulse-percentage modulated signal and amplitude modulated signal. The averaging circuit means responds to the pulse-percentage modulated signal and amplitude modulated signal to produce the analog output signal.

Preferably, the functional relationship between the differential magnitude and the resolution is linear; i.e., the magnitude of the differential magnitude equals a constant of proportionality times the magnitude of the resolution, and the constant of proportionality preferably is a multiple of 2 such as 16, 32, etc.

Preferably, the circuit means for producing the pair of analog control signals includes a pair of state-machine controlled time-averaging DAC sub-systems either of which can be implemented by a pulse-width modulated (PWM) DAC structure or by a related type of DAC structure such as a binary rate multiplying (BRM) DAC structure.

This invention can also be regarded as a DAC that includes three time-averaging DACs arranged in a multi-tier or tree configuration and controlled to provide a monotonic output. The tree configuration provides an advantage. In s prior art single-stage time-averaging DAC, designing for high resolution involves a tradeoff of significantly reduced bandwidth. Compared to a single-stage time-averaging DAC, a DAC arranged in a tree configuration provides improved bandwidth for any required resolution.

Each time-averaging DACs may be pulse-width modulated (PWM) DACs or a related type of DAC such as binary rate multiplying (BRM) DAC. A first one of these time-averaging DACs receives the output of both a second and a third of the time-averaging DACs. The second time-averaging DAC produces an analog control signal defining a common-mode magnitude. The third time-averaging DAC produces an analog control signal defining the sum of the common-mode magnitude and a differential magnitude.

A DAC embodying the invention has numerous advantages including simplicity and consequent low cost, and provides high resolution and yet has high bandwidth. A preferred embodiment is arranged to ensure monotonicity.

DETAILED DESCRIPTION OF THE PREFERRED EMBODIMENT

Figure 1A:
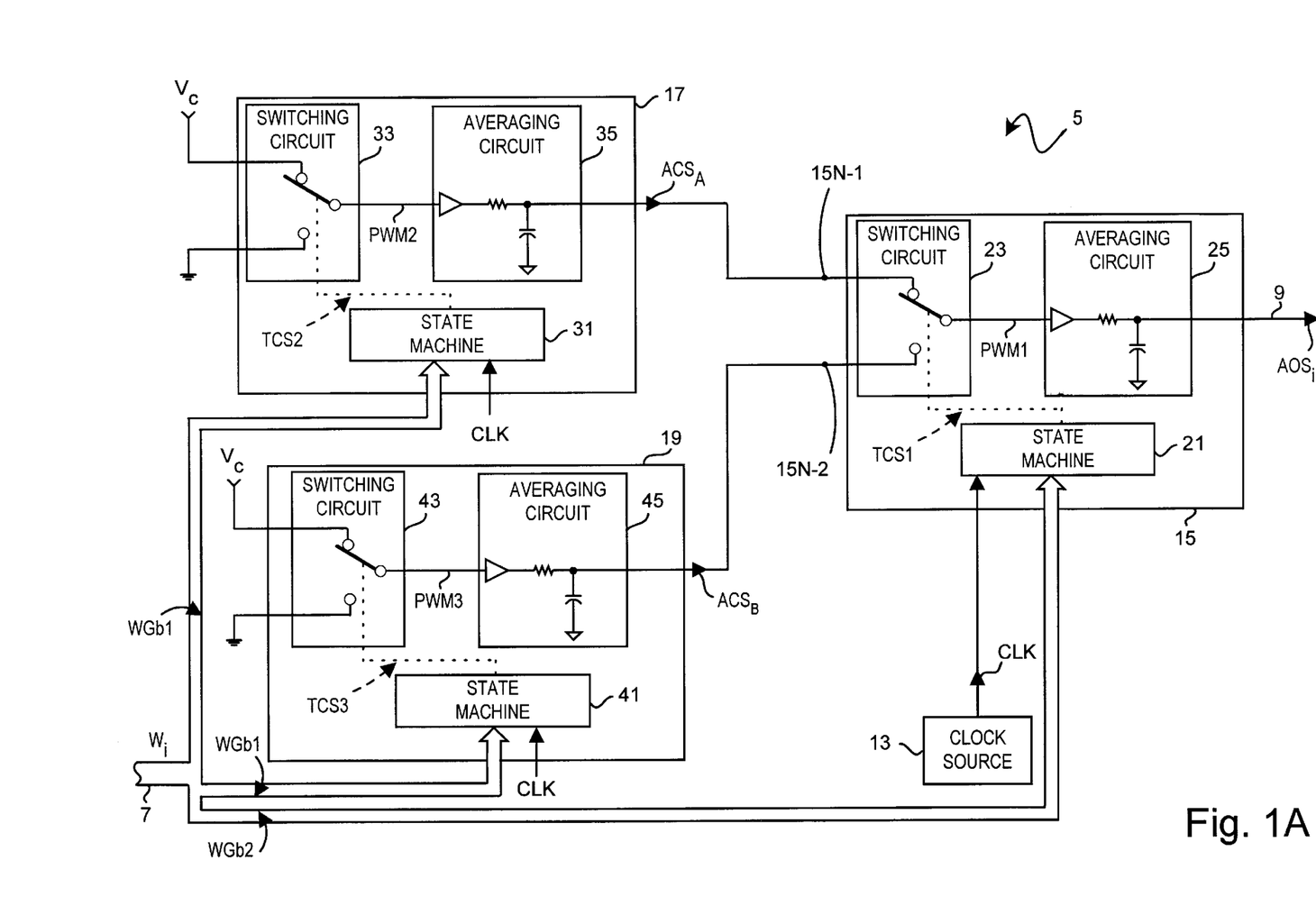
FIG. 1A is a block diagram of a DAC in accordance with a preferred embodiment of this invention.

With reference to FIG. 1, a high-resolution digital-to-analog converter (DAC) 5 constitutes a preferred embodiment of this invention. DAC 5 includes a digital input bus 7 and a conductor 9. On bus 7, DAC 5 receives each of a sequence of digital input words $W_1, \ldots W_i, \ldots W_N$ on a one word at a time basis. Each word includes a first group of bits WGb1 and a second group of bits WGb2. On conductor 9, DAC 5 produces an analog output signal AOS that defines a sequence of analog output magnitudes $AOS_1, \ldots AOS_i, \ldots AOS_N$ in correspondence with the sequence of words and in the form of a voltage potential relative to ground (i.e. 0 volts). Each analog output magnitude $AOS_i$ has a functional relationship to the value of the corresponding word $W_i$.

Figure 2:
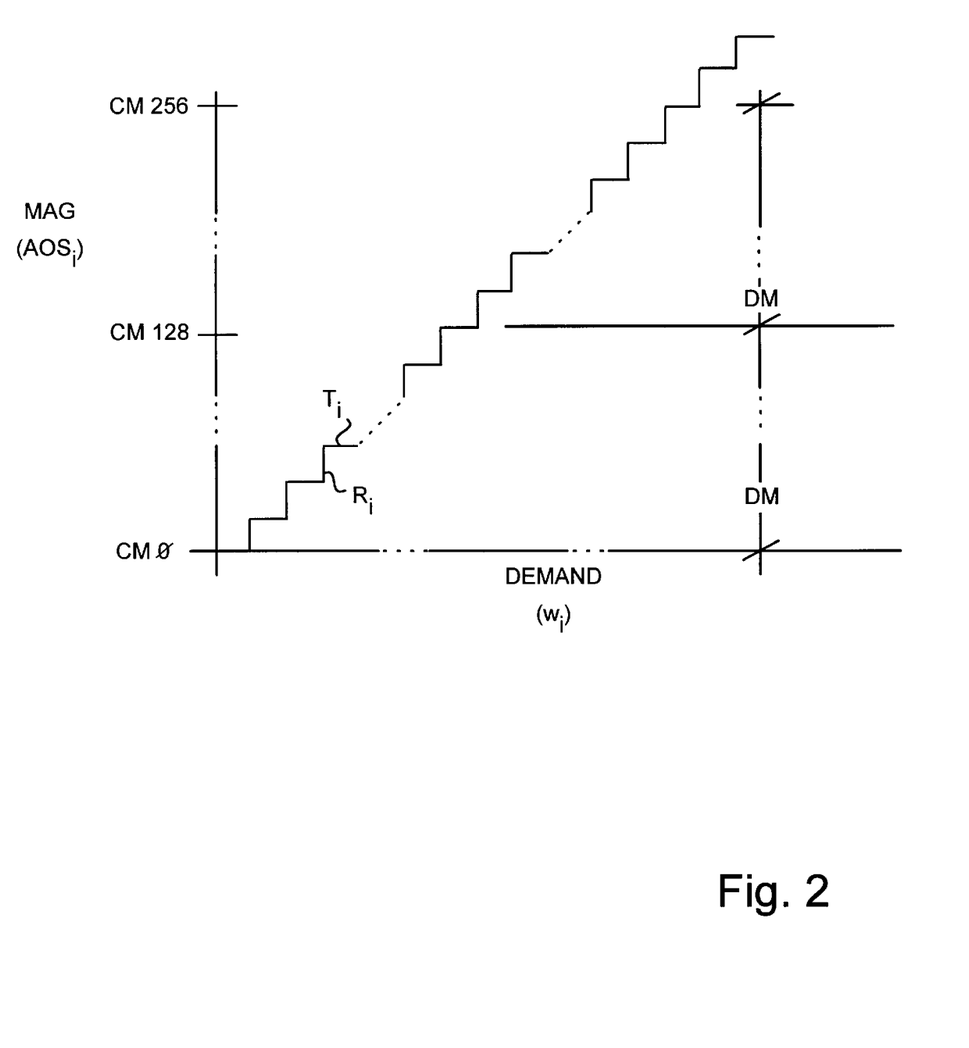
FIG. 2 a graph showing superimposed plots of portions of two staircase functions of the input word.

With reference to FIG. 2, a plot of this functional relationship with the magnitude of analog output signal AOS on a vertical axis and the value of word W on a horizontal axis, has the shape of a finely-stepped staircase (i.e., there are a large number of fine steps). Each such step can be viewed as defining a vertically-extending "riser" such as $R_i$ and a horizontally-extending "tread" such as $T_i$.

Figure 4:
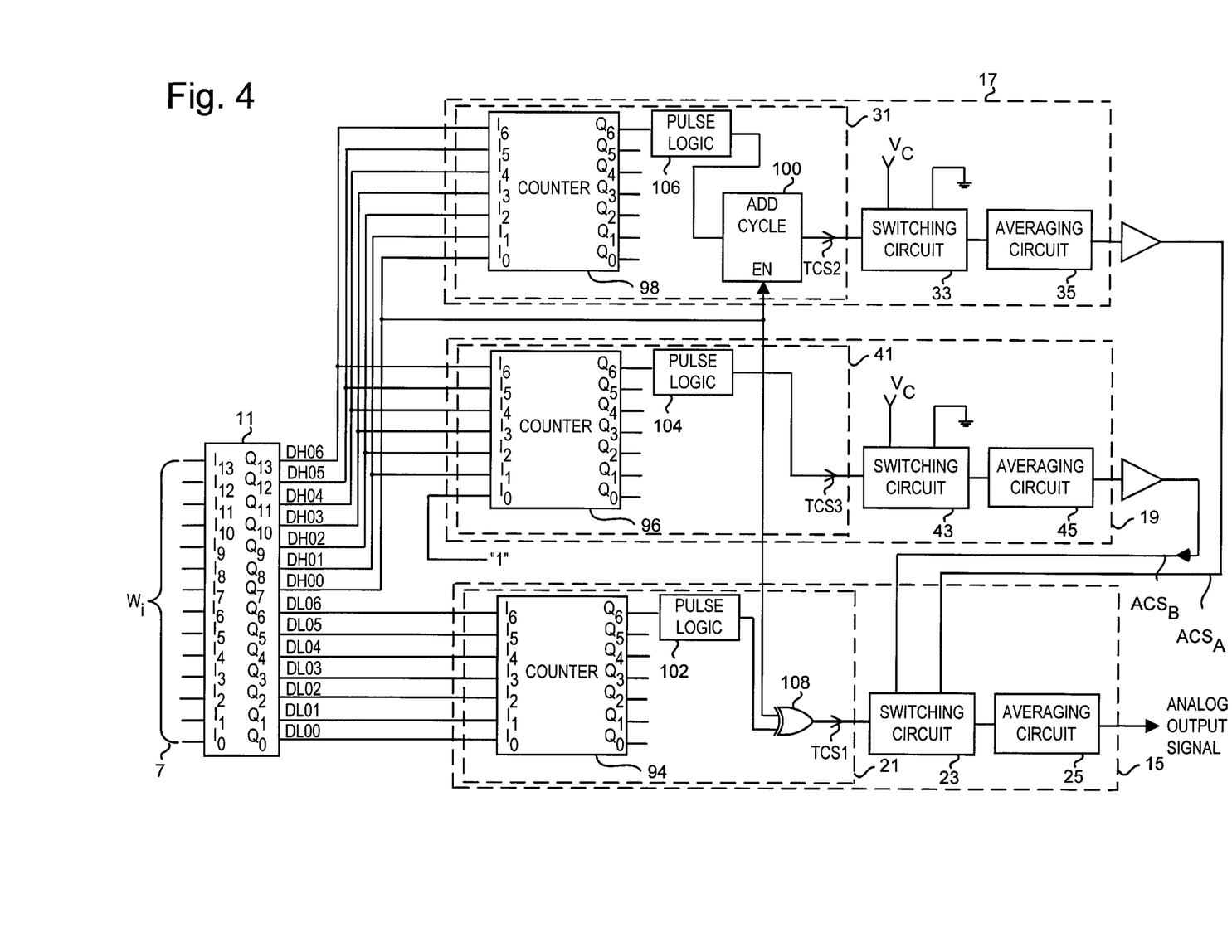
FIG. 4 is a block diagram similar to FIG. 1, with additional details.

With reference to FIG. 4, DAC 5 includes a buffer register 11 into which each word $W_i$ in the sequence is temporarily latched. Each word $W_i$ has a plurality of bit positions for establishing a resolution for DAC 5. Suitably, each word $W_i$ applied to DAC 5 has 14 bit positions, so as to provide very high resolution. These bit positions define the first and second groups of bits WGb1 and WGb2. The first group WGb1 suitably includes 7 bits identified as DH00 through DH06. The second group WGb2 suitably includes 7 bits identified as DL00 through DL06.

With 14 bit positions, each word $W_i$ can represent any one of $2^{14}$ values corresponding to the range from decimal 0 to decimal 16383. Suitably, DAC 5 receives power from a 5 volt power supply, and to represent the converted values corresponding to the decimal numbers from 0 to 16383, analog output signal AOS defines a multiplicity of substantially-equal fine steps of 305.176 microvolts per riser (this being equal to 5.0 volts divided by $2^{14}$) to increase from a minimum magnitude of 0 volts to a maximum magnitude of 4.99969 volts (i.e., 16383×305.176 microvolts per riser).

According to a distinguishing feature, DAC 5 comprises circuit means responsive to the first group of bits WGb1 for producing a pair of analog control signals $ACS_A$ and $ACS_B$. In accordance with operational features involved in an invention made by the inventor hereof that are also part of the best mode contemplated for DAC 5, there are multiple modes of operation of DAC 5. In one mode, the $ACS_A$ signal defines a common-mode magnitude while the $ACS_B$ signal defines the sum of the common-mode magnitude and a differential magnitude. In another mode, the $ACS_A$ defines the sum, and the $ACS_B$ signal defines the common mode magnitude.

The common-mode magnitude is a function of the first set of bits and the differential magnitude is a function of the resolution.

With reference again to FIG. 2, there will now be described the staircase function involving coarse steps for determining the common-mode magnitude. Each coarse step defines a respective one of a plurality of horizontally extending common-mode magnitudes CM0, CM128, CM256, etc., each pair of these magnitudes being separated by a substantially equal differential magnitude DM. For the suitable values involved in DAC 5, there is one coarse step for each 128 fine steps. Each common-mode magnitude equals the product of: 1) the value of a variable (referred to herein as the "switchback value"), 2) a scale factor, and 3) the number of fine steps per differential magnitude. The switchback value equals the decimal value defined by the first group of bits WGb1. The scale factor depends upon the ratio of the maximum potential of analog output signal $AOS_i$ to the number of fine steps (i.e., the resolution). DAC 5 suitably employs a scale factor of 305.176 microvolts per riser, and a differential magnitude of 128×305.176 microvolts. With these suitable parameters, the common-mode magnitudes CM0, CM128, and CM256 are 0 volts, 39.063 millivolts, and 78.125 millivolts.

The following examples provide specific cases that relate the switchback value and the common-mode magnitude to the first group of bits WGb1. For each digital word in a first range that extends from decimal 0 to decimal 127, each bit in the first set of bits WGb1 has the binary value 0 such that the switchback value equals decimal 0. Thus, the common-mode magnitude for each word in the first range is 0 volts. For each digital word in a second range that extends from decimal 128 to decimal 255, the binary values for the bits in the first set of bits WGb1 are 0000001 such that the switchback value equals decimal 1. Thus, the common-mode magnitude for each word in the second range is 39.063 millivolts.

With reference again to FIG. 1, DAC 5 includes a clock source 13 that generates a clocking signal CLK. Suitably, clocking signal CLK has a pulse repetition frequency of 20 megahertz (20 MHZ). In accordance with a distinguishing feature, DAC 5 includes a state-machine controlled time-averaging DAC subsystem 15 that includes switching circuit means that has a pair of inputs 15N-1 and 15N-2 for receiving the pair of analog control signals $ACS_A$ and $ACS_B$.

Preferably, the circuit means for producing the pair of analog control signals $ACS_A$ and $ACS_B$ includes a pair of state-machine controlled time-averaging DAC sub-systems, either of which can be implemented by pulse-width modulated (PWM) DAC structure or by a related type of DAC such as a binary rate multiplying (BRM) DAC structure. In DAC 5, this pair is implemented by time-averaging DAC subsystem 17 and time-averaging DAC subsystem 19. Each of the three state-machine controlled time-averaging DAC sub-systems includes a state machine, a switching circuit, and an averaging circuit. Each of the three state machines has an input for receiving a group of the bits of the word $W_i$, and an input for receiving the CLK signal, and an output for providing a timing control signal to the corresponding switching circuit.

As for time-averaging DAC subsystem 15, its main subsystems are identified as state machine 21, switching circuit 23, and averaging circuit 25. State machine 21 receives the second group of bits WGb2 and produces a time-varying control signal TCS1. Switching circuit 23 receives time-varying control signal TCS1 and the analog control signals $ACS_A$ and $ACS_B$ and produces a pulse width modulated signal PWM1. Averaging circuit 25 receives pulse width modulated signal PWM1 and produces analog output signal $AOS_i$. Because each word $W_i$, is divided into separately treated parts WGb1 and WGb2, the averaging period of time-averaging DAC subsystem 15 is only 64 microseconds ($2^7 \times 0.050$ Ts=64 Ts). This provides a substantial bandwidth advantage over those prior art DACs that require a much longer averaging period.

As for time-averaging DAC subsystem 17, its main subsystems are identified as state machine 31, switching circuit 33, and averaging circuit 35. State machine 31 receives the first group of bits WGb1 and produces a time-varying control signal TCS2. Switching circuit 33 receives time-varying control signal TCS2 and two fixed potentials $V_C$ and 0 volts, and produces a pulse width modulated signal PWM2. Averaging circuit 35 receives pulse width modulated signal PWM2 and produces analog control signal $ACS_A$.

As for time-averaging DAC subsystem 19, its main subsystems are identified as state machine 41, switching circuit 43, and averaging circuit 45. State machine 41 receives the first group of bits WGb1 and produces a time-varying control signal TCS3. Switching circuit 43 receives time-varying control signal TCS3 and two fixed potentials $V_C$ and 0 volts, and produces a pulse width modulated signal PWM3. Averaging circuit 35 receives pulse width modulated signal PWM3 and produces analog control signal $ACS_B$.

With reference to FIGS. 3A–3D, there will now be described operational features involved in an invention made by the inventor hereof that are also part of the best mode contemplated for DAC 5.

Figure 3A:
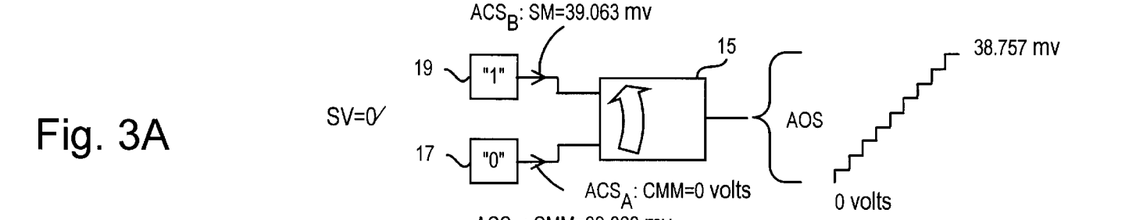
FIGS. 3A, 3B, 3C and 3D are diagrams each of which illustrates a mode of operation in accordance with a preferred practice for ensuring monotonicity.

As for FIG. 3A, it relates to a first mode of operation in which word $W_i$ has values in a range for which the switchback value ("SV") is an even number. Specifically, in FIG. 3A, $W_i$ is in its lowest range, i.e., from decimal 0 to decimal 127. In FIG. 3A, the switchback value is 0 (i.e., each of the bits in the first group of bits WGb1 is 0); this being indicated by the digit 0 shown in the block representing time-averaging DAC subsystem 17. Whenever the switchback value is an even number, analog control signal $ACS_A$ produced by time-averaging DAC subsystem 17 defines the common-mode magnitude, analog control signal $ACS_B$ produced by time-averaging DAC subsystem 19 defines the sum magnitude ("SM"), and state machine 21 in time-averaging DAC subsystem 15 causes signal TCS1 to have a pulse width that is directly proportional to the value of the second group of bits WGb2. The up-directed arrow inside the block representing time-averaging DAC subsystem 15 indicates this direct proportionality. The digit "1" inside the block representing time-averaging DAC subsystem 19 indicates that its output defines the sum magnitude based on the switchback value plus "1."

In FIG. 3A, analog control signal $ACS_A$ defines the common-mode magnitude at 0 volts, analog control signal $ACS_B$ defines the sum magnitude "SM" at 39.063 millivolts, and the analog output signal AOS has one of the magnitudes from a local minimum of 0 volts to a local maximum of 38.757 millivolts (305.176 Tv.×($2^7$–1)), depending upon the value of WGb2.

The portion of the staircase for analog signal AOS shown at the right side of FIG. 3A shows the steps with treads from 0 volts to 38.757 millivolts.

Figure 3B:
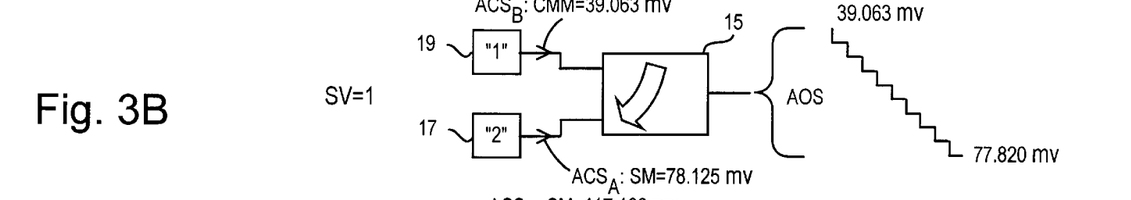

As for FIG. 3B, it relates to a second mode of operation in which the word $W_i$ has values in a range for which the switchback value is an odd number. Specifically, in FIG. 3B, $W_i$ is in its second lowest range with values from decimal 128 to decimal 255. In FIG. 3B, the switchback value is 1; this being indicated by the digit 1 shown in the block representing time-averaging DAC subsystem 19. Whenever the switchback value is an odd number, analog control signal $ACS_B$ produced by time-averaging DAC subsystem 19 defines the common-mode magnitude, analog control signal $ACS_A$ produced by time-averaging DAC subsystem 17 defines the sum magnitude "SM," and state machine 21 in time-averaging DAC subsystem 15 causes signal TCS1 to have a pulse width that is proportional to the complement of the value of the second group of bits WGb2.

The down-directed arrow inside the block representing time-averaging DAC subsystem 15 indicates this complementary proportionality. The digit "2" inside the block representing time-averaging DAC subsystem 17 indicates that its output defines the sum magnitude based on the switchback value plus "1."

In FIG. 3B, analog control signal $ACS_B$ defines the common-mode magnitude at 39.063 millivolts, analog control signal $ACS_A$ defines the sum magnitude at 78.125 millivolts, and the analog output signal AOS has one of the magnitudes from a local minimum of 39.063 millivolts to a local maximum of 77.820 millivolts.

Figure 3C:
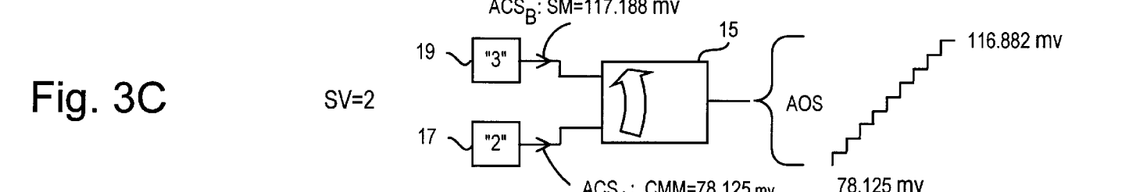

As for FIG. 3C, it relates to the same first mode of operation described above with reference to FIG. 3A. In FIG. 3C, word $W_i$ is in its third lowest range, i.e., from decimal 256 to decimal 383. Being in the first mode of operation, analog control signal $ACS_A$ defines the common-mode magnitude (at 78.125 millivolts for this range), analog control signal $ACS_B$ defines the sum magnitude (at 117.188 millivolts for this range), and the analog output signal AOS has one of the magnitudes from a local minimum of 78.125 millivolts to a local maximum of 116.882 millivolts.

Figure 3D:
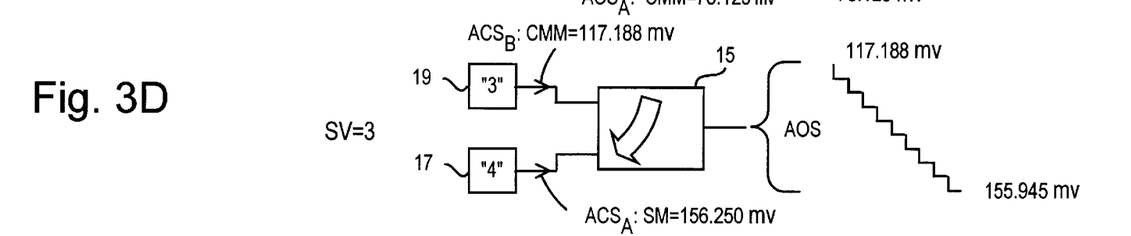

As for FIG. 3D, it relates to the same second mode of operation described above with reference to FIG. 3B. Specifically, in FIG. 3D, word $W_i$ is in its fourth lowest range, i.e., from decimal 384 to decimal 511. Being in the second mode of operation, analog control signal $ACS_B$ defines the common-mode magnitude (at 117.188 millivolts for this range), analog control signal $ACS_A$ defines the sum magnitude (at 156.250 millivolts for this range), and the analog output signal AOS has one of the magnitudes from a local minimum of 117.188 millivolts to a local maximum of 155.945 millivolts.

Figure 1B:
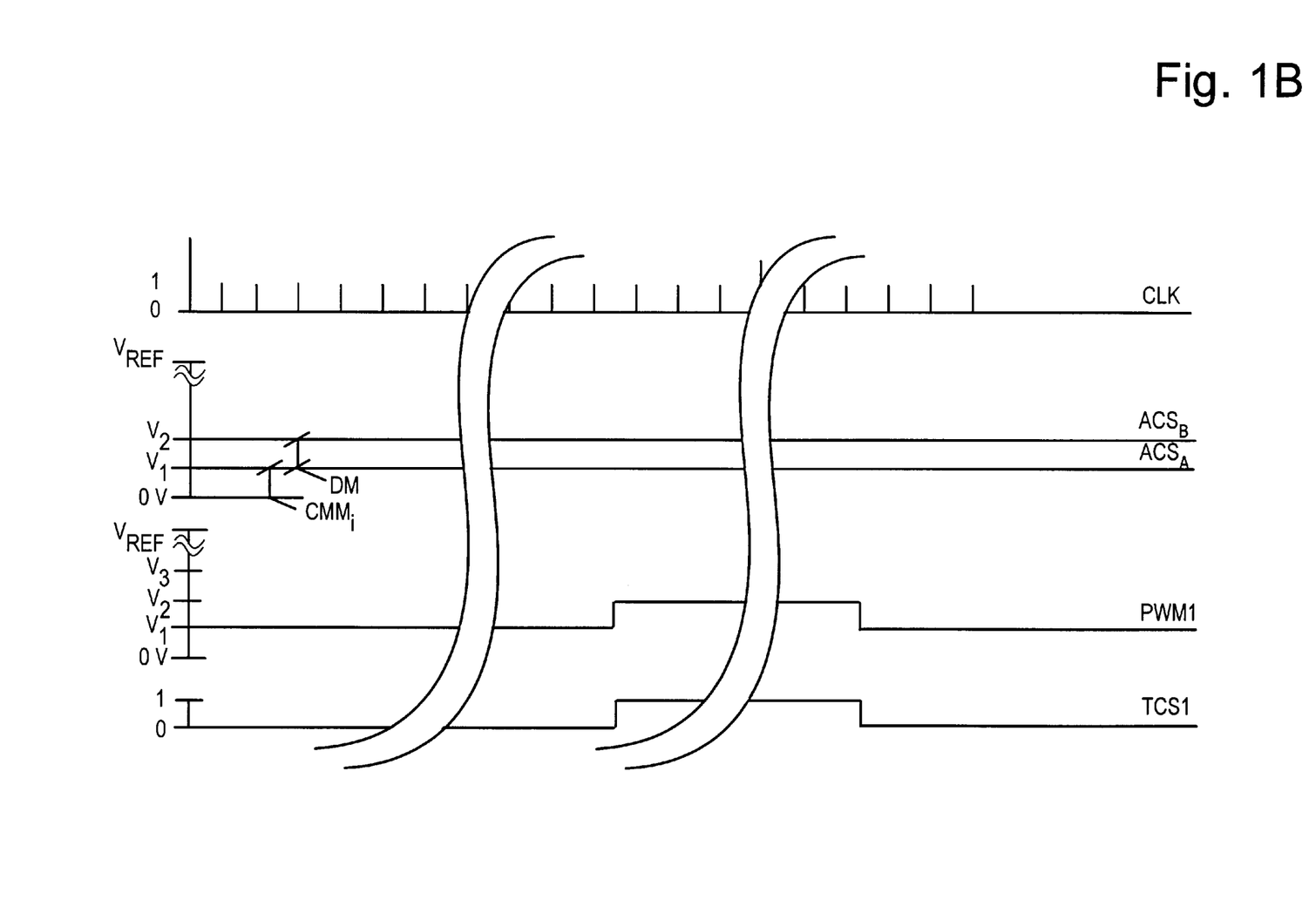
FIG. 1B is a timing diagram showing signal waveforms for an example of operation in a first mode of operation of the DAC of FIG. 1A.
Figure 1C:
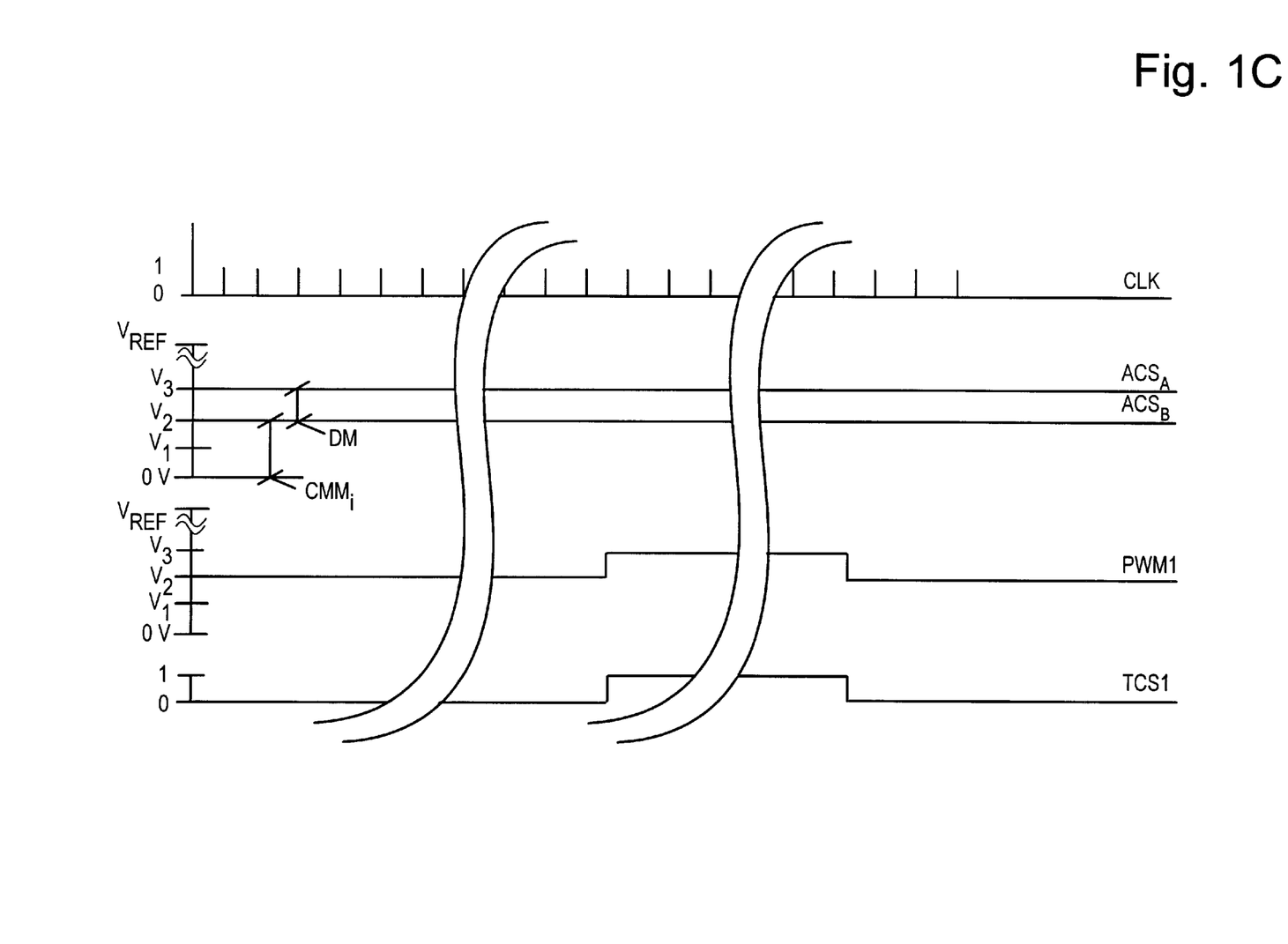
FIG. 1C is a timing diagram showing signal waveforms for an example of operation in a second mode of operation of the DAC of FIG. 1A.

With reference to FIGS. 1B and 1C, there will now be described signal waveforms for examples of operation in the first mode and in the second mode. The timing diagrams of FIGS. 1B and 1C have a common time axis that is broken to indicate continuing operation between the breaks. The CLK signal defines regularly spaced timing transitions.

In FIG. 1B, DAC 5 operates in the first mode and $ACS_A$ defines the common mode magnitude $CMM_i$ and $ACS_B$ defines the sum magnitude $SM_i$. The common mode magnitude $CMM_i$ in FIG. 1B has the magnitude $V_1$ and the sum magnitude $SM_i$ has the magnitude $V_2$. The magnitude of differential magnitude DM equals $(V_2-V_1)$. The TCS1 signal defines pulses by switching between logical 1 and logical 0, and each pulse has a pulse width that is directly proportional to the value of the second group of bits WGb2. The PWM1 signal is amplitude and pulse-width modulated such that its average value is between $CMM_i$ and $SM_i$. As for amplitude modulation, its pulses switch between $V_1$ and $V_2$.

In FIG. 1C, DAC 5 operates in the second mode and $ACS_B$ defines the common mode magnitude $CMM_i$ and $ACS_A$ defines the sum magnitude $SM_i$. The common mode magnitude $CMM_i$ in FIG. 1C has the magnitude $V_2$ and the sum magnitude $SM_i$ has the magnitude $V_3$. The magnitude of differential magnitude DM equals $(V_3-V_2)$. The TCS1 signal defines pulses by switching between logical 1 and logical 0, and each pulse has a pulse width that is proportional to the complement of the value of the second group of bits WGb2. The PWM1 signal is amplitude and pulse-width modulated such that its average value is between $CMM_i$ and $SM_i$. As for amplitude modulation, its pulses switch between $V_2$ and $V_3$.

Figure 5:
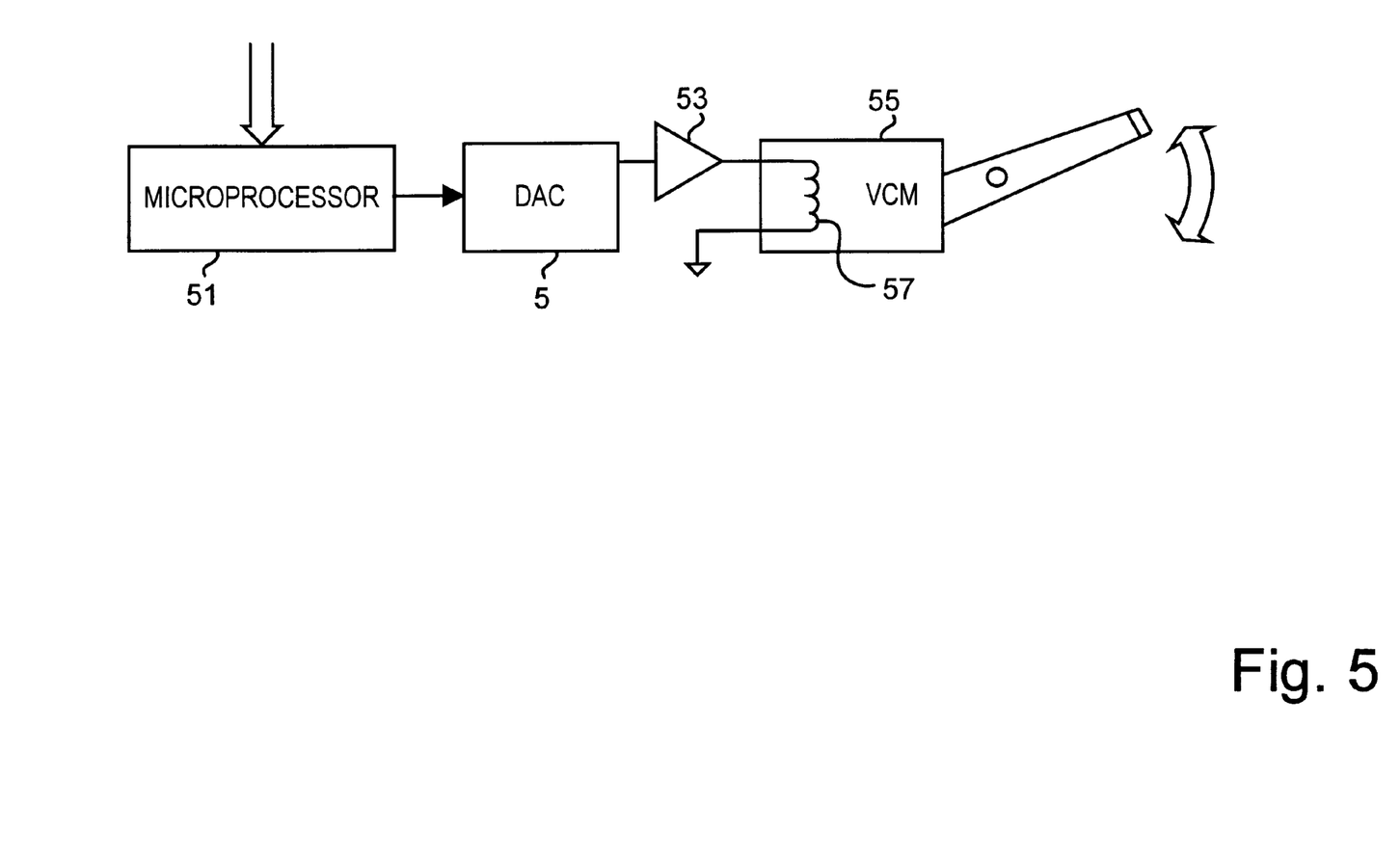
FIG. 5 is a block diagram of a portion of a servo for a hard disk drive in which a DAC embodying the invention is employed as a demand DAC.

With reference to FIG. 5, DAC 5 serves as a demand DAC in a disk drive head-positioning servo that includes a microprocessor 51 that sequentially supplies words to DAC 5. The servo also includes an actuator motor driver circuit 53 and an actuator motor 55 having a coil 57. Circuit 53 receives the analog output signal of DAC 5 and in response controls the magnitude of current flowing through coil 57.

With reference to FIG. 4, each input word $W_i$ is latched into buffer register 11. The least-significant seven latched bits are designated DL00–DL06, and the most-significant seven latched bits are designated DH00–DH06. In time-averaging DAC subsystem 15, state machine 21 suitably includes a counter 94, a pulse logic 102, and an Exclusive OR gate 108.

In time-averaging DAC subsystem 17, state machine 31 suitably includes a counter 98, a pulse logic 106, and an adder 100.

In time-averaging DAC subsystem 19, state machine 41 suitably includes a counter 96 and a pulse logic 104.

Each of presettable counters 94, 96, and 98 has 7 stages as indicated in conventional manner by the inputs I0 to I6 and the outputs Q0 to Q6. Counter 94 receives DL00 through DL06, and its Q6 output is connected to the input of pulse logic 102. Exclusive OR gate 108 has one input connected to the output of pulse logic 102 and another input connected to receive DH00. Exclusive OR gate 108 produces the TCS1 signal. Counter 96 receives a binary "1" at its I0 input and receives DH01 through DH06 at its I1 through I6 inputs. The Q6 output of counter 96 is connected to the input of pulse logic 104, which produces the TCS3 signal. Counter 98 receives DH00 through DH06, and its Q6 output is connected to the input of pulse logic 106. The output of pulse logic 106 is connected to cycle adder 100, which produces the TCS2 signal.

The state machines depicted in FIG. 4 implement a suitable way to control the mode of operation of DAC 5 such that it operates in the first mode while the switchback value is an even number (i.e., whenever bit DH00 is "0"), and operates in the second mode while the switchback value is an odd number (i.e., whenever bit DH00 is "1"). In particular, one input of exclusive-OR gate 108 is coupled to bit DH00 to control inversion of TCS1.

Figure 6A:
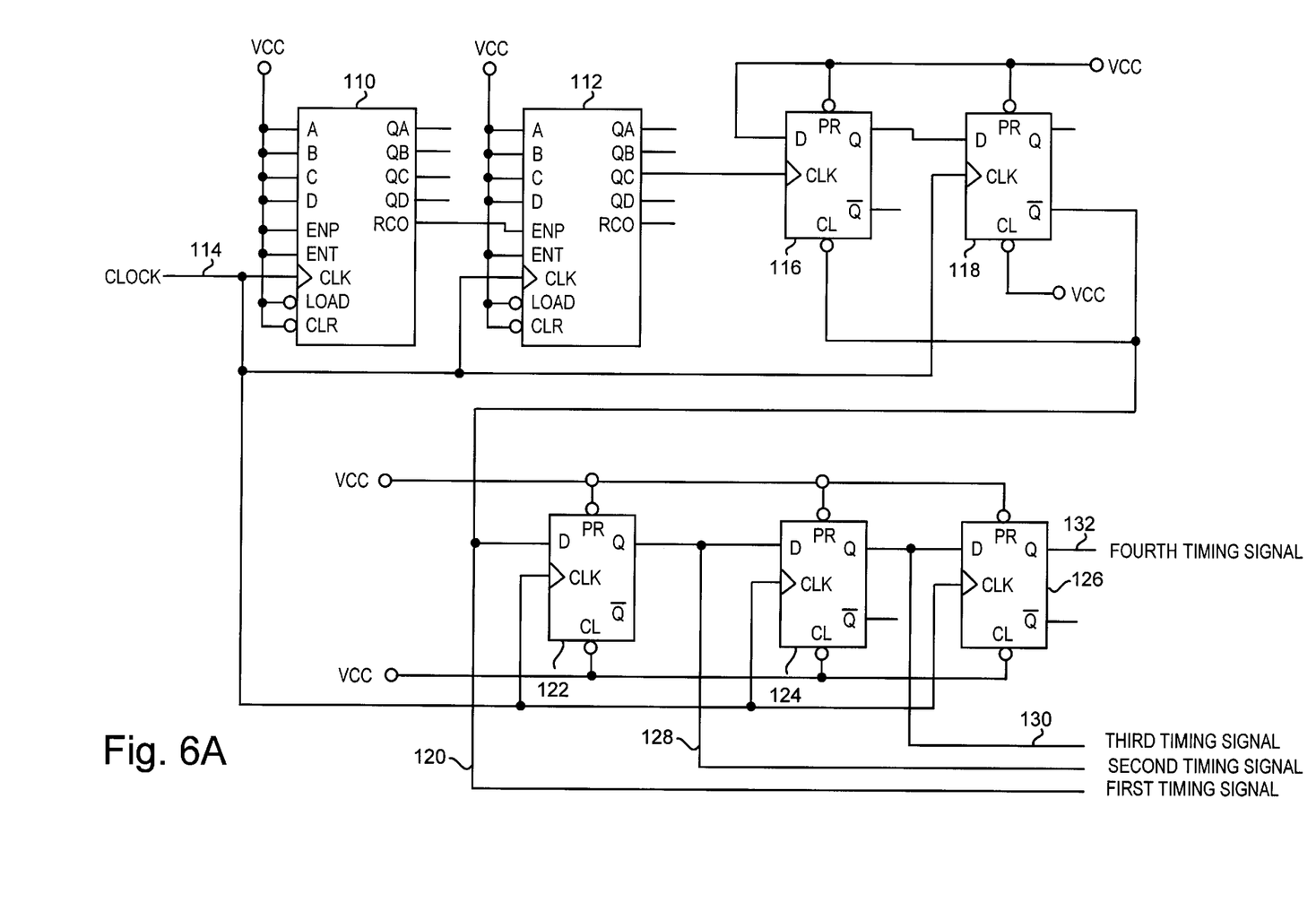
FIG. 6A is a block diagram of a timing generator portion of a state machine suitable for incorporation in the DAC of FIG. 1.
Figure 6B:
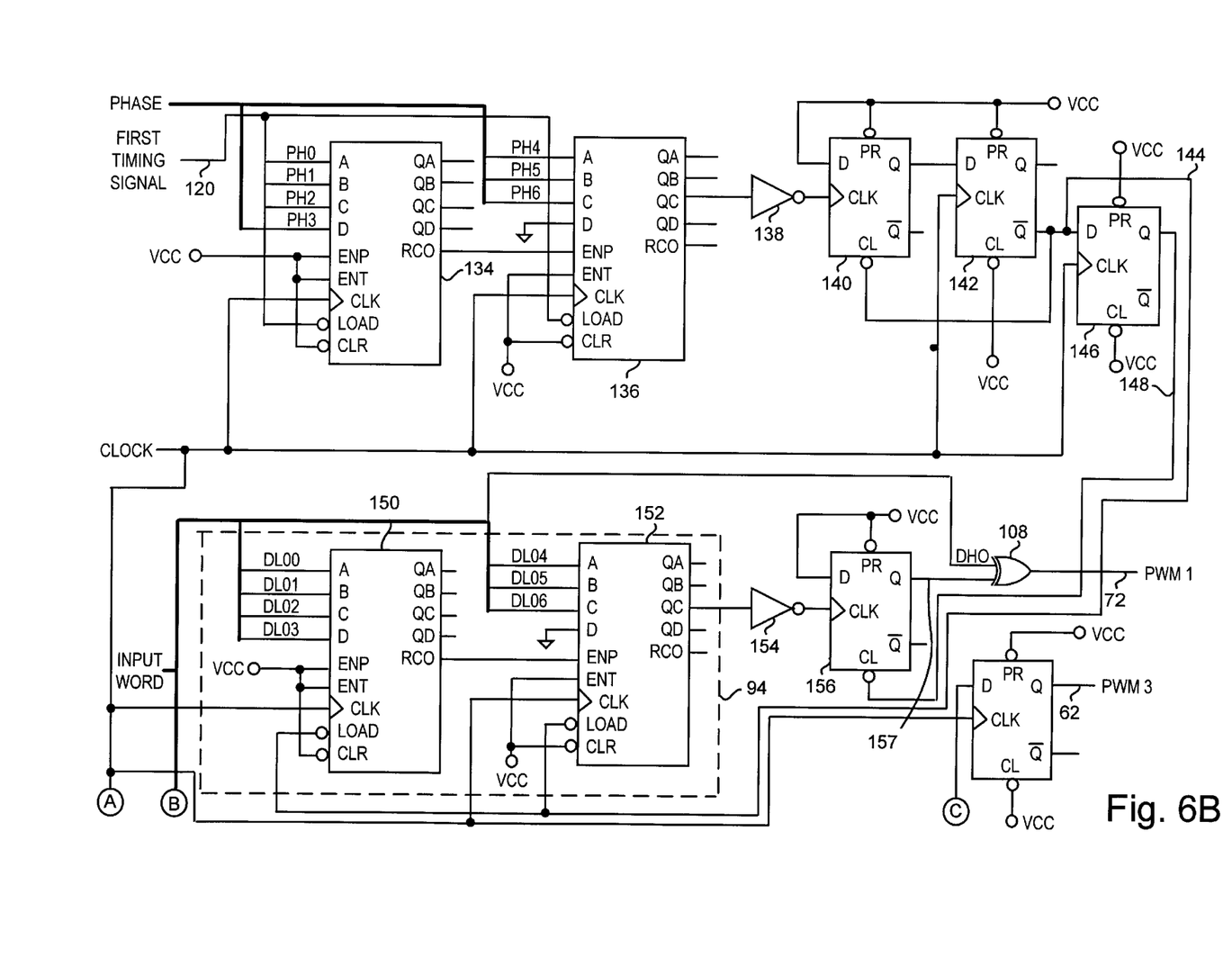
FIG. 6B is a block diagram of another portion of the state machine shown in part in FIG. 7A.
Figure 6C:
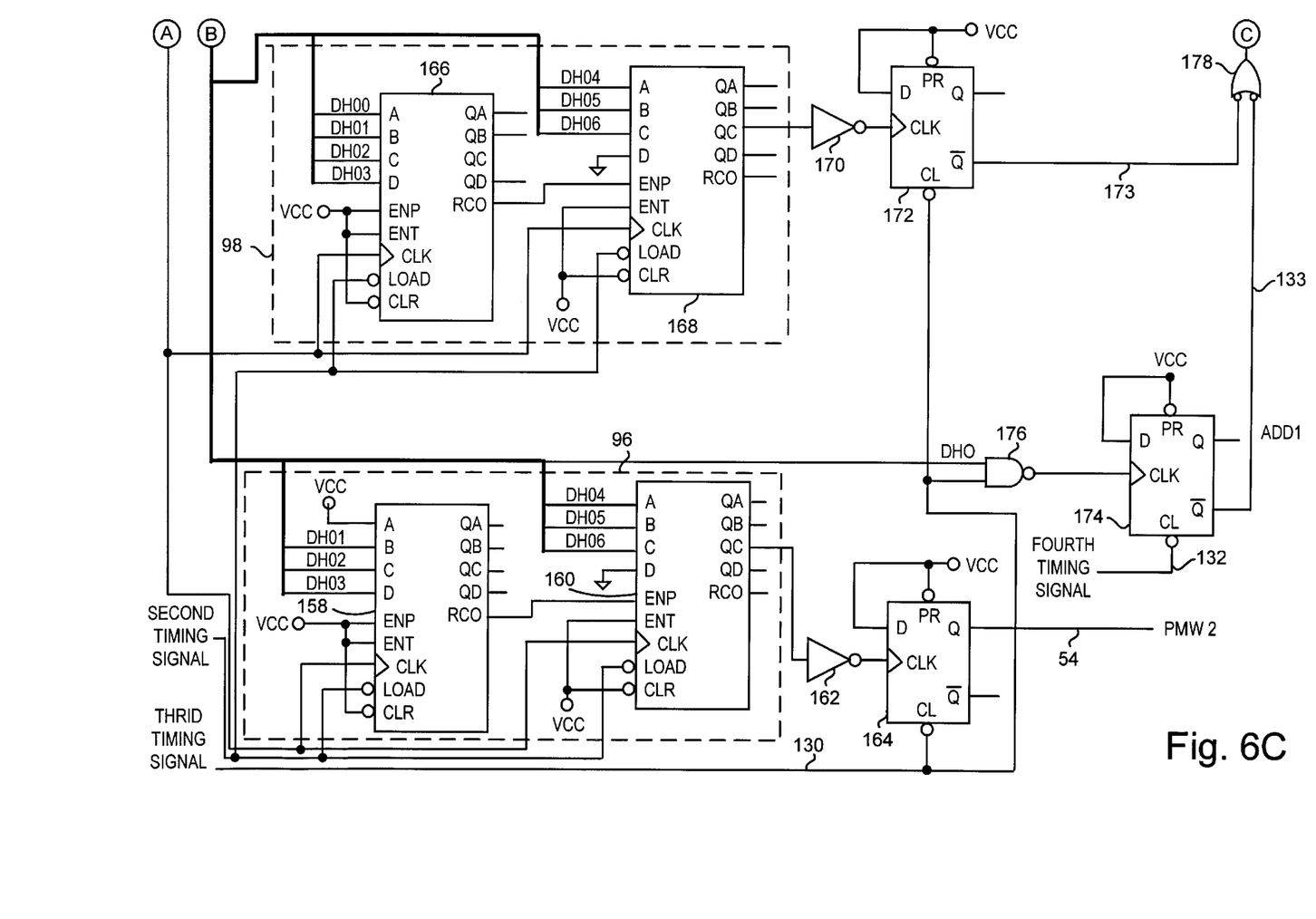
FIG. 6C is a block diagram of another portion of the state machine shown in part in FIG. 7A.
Figure 7:
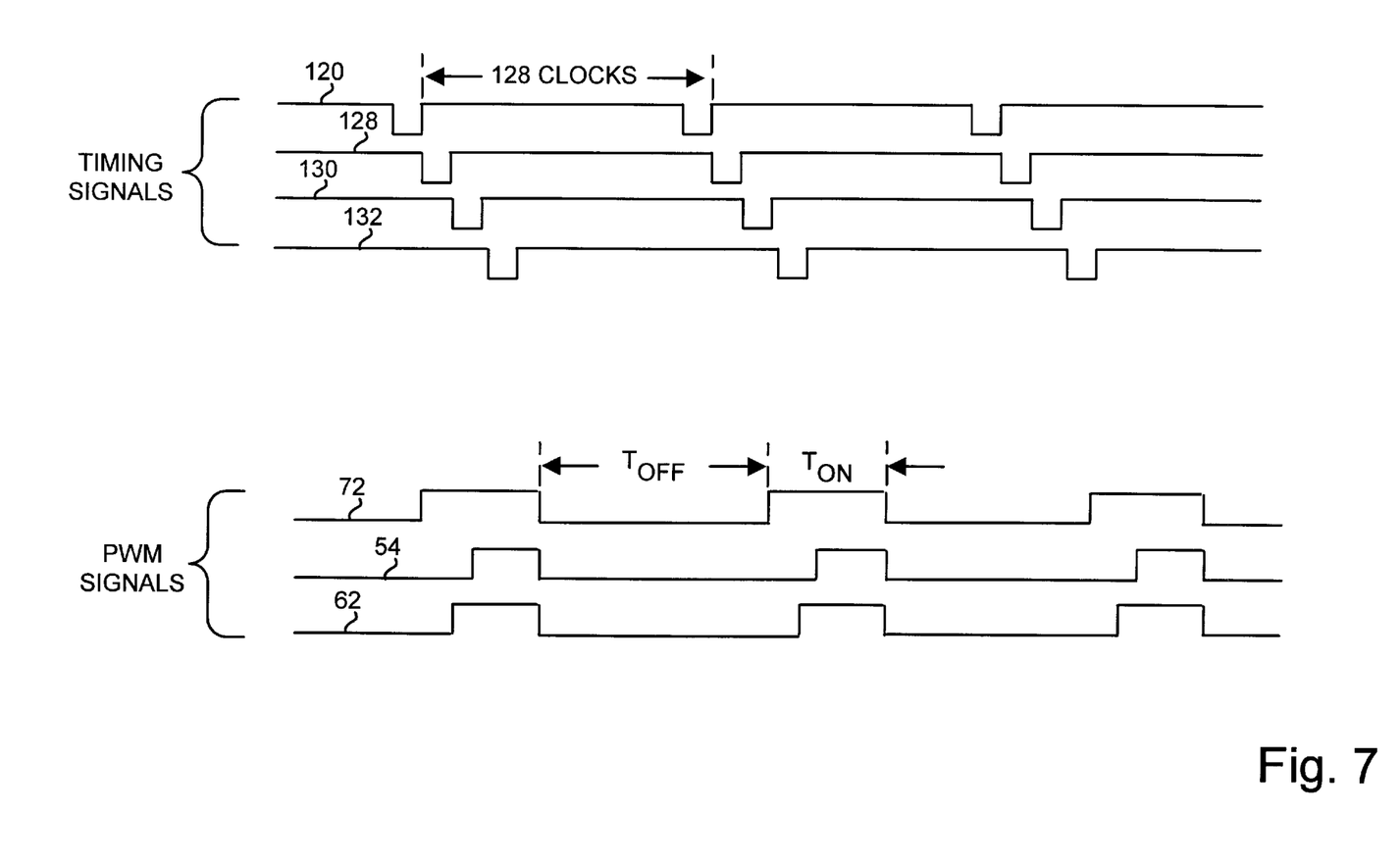
FIG. 7 is a timing diagram showing signal waveforms relating to operation of the state machine of FIGS. 6A–6C.

With reference to FIGS. 6A–6C, there will now be described additional details concerning suitable structure for implementing DAC 5. Two cascaded counters 110 and 112 continuously count from zero to 127 in a circular manner. The clock signal 114 preferably has a suitable frequency for use in a disk drive, such as 20 MHz. Two flip-flops 116 and 118 produce a first timing signal 120 defined by a single low timing pulse every 128 clock cycles. Three flip-flops 122, 124 and 126 produce second, third and fourth timing signals 128, 130 and 132, respectively. Second timing signal 128 is delayed by one clock cycle from first timing signal 120. Third timing signal 132 is delayed by one clock cycle from second timing signal 128. Fourth timing signal 132 is delayed by one clock cycle from third timing signal 130. The group of 128 clock cycles between successive groups of timing pulses defines the PWM period or cycle time. FIG. 7 (not to scale) illustrates this timing.

A phase adjusting counter is formed from two cascaded counters 134 and 136. A phase value can be selected and loaded into counters 134 and 136 to adjust the timing of low-order PWM1 signal 72 in relation to high-order PWM2 signal 54 and PWM3 signal 62. Such adjustment may be desirable to control second-order effects of the R-C charging curve or for other reasons. Counters 134 and 136 produce a signal at intervals determined by the difference between 128 and the phase value. For example, if the selected phase value is six, counters 134 and 136 count from six to 128 and produce a signal 122 clock cycles after the timing pulses are asserted (or six clock cycles before the timing pulses are again asserted). An inverter 138 inverts this signal and provides it to a pulse generator defined by two flip-flops 140 and 142. The pulse generator produces a load signal 144. In response to assertion of load signal 144, counter 94 loads the binary value described above with respect to FIG. 4. A flip-flop 146 delays load signal 144 by one clock cycle to produce a PWM CLR signal 148.

Counter 94 includes two cascaded counters 150 and 152 and provides an output signal at successive time intervals. The time intervals are determined by counters 110 and 112 with a phase shift determined by counters 134 and 136 with a period determined by the value loaded into counter 94. An inverter 154 inverts the output signal and provides the inverted signal to a flip-flop 156. The Q output of flip-flop 156 is clocked high by the inverted signal and signals the beginning of the on-time ($T_{ON}$) of each pulse of low-order PWM1 signal 72. The assertion of PWM CLR signal 148 clears flip-flop 156, thus signaling the beginning of the off-time ($T_{OFF}$) of each pulse. Whether the on-time of the duty cycle is represented by a high or low voltage depends upon the state of DH0, which controls inversion of low-order signal 157 via exclusive-ORgate 108.

Counter 96 includes two cascaded counters 158 and 160 and provides an output signal at successive time intervals determined by the value loaded into counter 96. The assertion of second timing signal 128 loads counter 96. An inverter 162 inverts the output signal and provides the inverted signal to a flip-flop 164. The Q output 54 of flip-flop 164 is clocked high by the signal from inverter 162 and signals the beginning of the on-time of each pulse of high-order PWM2 signal 54. The assertion of third timing signal 130 clears flip-flop 164, thus signaling the beginning of the off-time of each pulse.

Counter 98 includes two cascaded counters 166 and 168 and provides an output signal at successive time intervals determined by the value loaded into counter 98. The assertion of second timing signal 128 loads counter 98. An inverter 170 inverts the output signal and provides the inverted signal to a flip-flop 172. The QNOT output 173 of flip-flop 172 is clocked low by the inverted signal. The low output 173 of flip-flop 172 signals the beginning of the on-time of each pulse of DAC-step PWM3 signal 62. The assertion of third timing signal 130 clears flip-flop 172. When bit DH0 is "1," cycle adder 100 extends the on-time for an additional clock cycle. Cycle adder 100 includes another flip-flop 174, a NAND gate 176, and another NAND gate 178. When bit DH0 is "1," the QNOT output 133 of flip-flop 174 is clocked low in response to assertion of third timing signal 130. Then, assertion of fourth timing signal 132 clears flip-flop 174 after one cycle.

We claim:

1. A digital-to-analog converter (DAC) for converting a digital input word to an analog output signal, the digital input word having a plurality of bit positions for establishing a resolution for the DAC, the plurality of bit positions defining first and second groups of bits, the DAC comprising:

circuit means responsive to the first group of bits for producing a pair of analog control signals, one of the pair defining a common-mode magnitude while the other of the pair defines a sum of the common-mode magnitude and a differential magnitude, the common-mode magnitude being a function of the value of the first set of bits and the differential magnitude being a function of the number of bit positions in the first group of bits;

a clock for generating a clocking signal;

a state machine having an input for receiving the clocking signal, an input for receiving the second groups of bits, and an output for providing a time-varying control signal;

switching circuit means having a pair of inputs for receiving the pair of analog control signals, and an input for receiving the time-varying control signal, and an output for providing a pulse-percentage and amplitude modulated signal; and averaging circuit means responsive to the pulse-percentage and amplitude modulated signal for producing the analog output signal.

2. The DAC of claim 1, wherein the time-varying control signal causes the switching circuit means to provide the pulse-percentage and amplitude modulated signal in the form of a pulse-width modulated and amplitude modulated signal.

3. The DAC of claim 1, wherein the circuit means comprises a pair of time-averaging DAC subsystems, each of which includes a state machine responsive to the clocking signal.

4. The DAC of claim 3, wherein each of the pair of time-averaging DAC subsystems includes a respective switching circuit that has a pair of inputs each of which operates at a fixed potential.

5. The DAC of claim 3, wherein each of the time-averaging DAC subsystems is a PWM DAC subsystem.

6. A digital-to-analog converter (DAC) for converting a digital input word to an analog output signal, the digital input word having a plurality of bit positions for establishing a resolution for the DAC, the plurality of bit positions defining first and second groups of bits, the DAC comprising:

circuit means responsive to the first group of bits for producing a pair of analog control signals, one of the pair defining a common-mode magnitude while the other of the pair defines a sum of the common-mode magnitude and a differential magnitude, the common-mode magnitude being a function of the value of the first set of bits and the differential magnitude being a function of the number of bit positions in the first group of bits;

a clock for generating a clocking signal;

a time-averaging DAC subsystem comprising:

a state machine having an input for receiving the clocking signal, an input for receiving the second groups of bits, and an output for providing a time-varying control signal;

switching circuit means having a pair of inputs for receiving the pair of analog control signals, and an input for receiving the time-varying control signal, and an output for providing a modulated signal that is modulated both in pulse-percentage and in amplitude; and averaging circuit means responsive to the pulse-percentage and amplitude modulated signal for producing the analog output signal.

7. The DAC of claim 6, wherein the time-averaging subsystem has a first mode of operation and a second mode of operation, wherein while operating in the first mode of operation the time-varying control signal has a waveform determined in accordance with a directly proportional relationship to the value of the second group of bits, and while operating in the second mode of operation the time-varying control signal has a waveform determined in accordance with a complementary relationship to the value of the second group of bits.

8. The DAC of claim 7, wherein the time-varying control signal causes the switching circuit means to provide the pulse-percentage and amplitude modulated signal in the form of a pulse-width modulated and amplitude modulated signal.

9. The DAC of claim 7, wherein the circuit means comprises a pair of time-averaging DAC subsystems, each of which includes a state machine responsive to the clocking signal.

10. The DAC of claim 9, wherein each of the pair of time-averaging DAC subsystems includes a respective switching circuit that has a pair of inputs each of which operates at a fixed potential.

11. The DAC of claim 9, wherein each of the time-averaging DAC subsystems is a PWM DAC subsystem.

\* \* \* \* \*